United States Patent [19]

Kapitulnik

[11] Patent Number: 5,090,819
[45] Date of Patent: Feb. 25, 1992

[54] SUPERCONDUCTING BOLOMETER

[75] Inventor: Aharon Kapitulnik, Palo Alto, Calif.

[73] Assignee: Conductus, Inc., Sunnyvale, Calif.

[21] Appl. No.: 569,435

[22] Filed: Aug. 20, 1990

[51] Int. Cl.$^5$ .................. G01N 25/20; H01L 39/00; G01K 7/16

[52] U.S. Cl. .................. 374/176; 374/121; 250/336.2; 505/847; 505/849

[58] Field of Search ............ 374/121, 176; 250/336.2; 505/847, 848, 849

[56] References Cited

U.S. PATENT DOCUMENTS

| | | | |
|---|---|---|---|
| 4,454,522 | 6/1984 | de Lozanne | 357/55 |
| 4,464,065 | 8/1984 | Wolf et al. | 250/336.2 |
| 4,940,693 | 7/1990 | Shappirio et al. | 357/65 |
| 4,978,853 | 12/1990 | Hilal | 250/336.2 |

FOREIGN PATENT DOCUMENTS

| | | | |
|---|---|---|---|
| 0378459 | 7/1990 | European Pat. Off. | 250/336.2 |
| 0077974 | 3/1989 | Japan | 357/30 |
| 0747370 | 9/1982 | U.S.S.R. | 250/336.2 |

OTHER PUBLICATIONS

Golovashkin, A. I. et al., "Epitaxial Growth of YBa$_2$Cu$_3$O$_{7-x}$ Films on MgO Substrates," Sov. Tech. Phys. Lett. 15(2) (Feb. 1989).
Aida, T. et al., "Preparation of YBa$_2$Cu$_3$O$_{7-x}$ Superconducting Thin Films by R-F Magnetron Sputtering," Japanese Journal of Applied Physics, vol. 26, No. 9 (Sep. 1987).
Clarke, J. et al., "Superconductive Bolometers for Submillimeter Wavelengths," J. Appl. Phys. 48(12) (Dec. 1977).
Downey, P. M. et al., "Monolithic silicon bolometers," Applied Optics, vol. 23, No. 6 (15 Mar. 1984).
Sauvageau, J. E. et al., "Superconducting Kinetic Inductance Bolometer," Applied Superconductivity Conference (Sep. 1988).

Primary Examiner—William A. Cuchlinski, Jr.
Assistant Examiner—Diego F. F. Gutierrez
Attorney, Agent, or Firm—Marvin E. Jacobs

[57] ABSTRACT

A superconducting transition edge bolometer is constructed using high critical temperature conducting films by stabilizing a substrate of magnesium oxide or sapphire with a silicon base that is bonded to the substrate using a thermally conductive bonding layer. The base is etched away in the region of the desired radiation detecting portion of the superconductor establishing a controlled thermal connection between the detecting portion and the base which base serves as a thermal bath for the bolometer.

18 Claims, 2 Drawing Sheets

SUPERCONDUCTING BOLOMETER

DESCRIPTION

1. Technical Field

This invention relates to the production of bolometers for the detection of infrared radiation, and is focused on the special problems associated with using high critical temperature superconductors in such production.

2. Background of the Invention

Very sensitive bolometer detectors for sensing thermal radiation may be made from superconducting materials. The electrical resistance of a superconductor is zero below a certain transition temperature characteristic of the material. However, the resistance increases very sharply as the temperature rises through a transition region where the material loses its superconducting properties and becomes a normal conductor. If the temperature of the superconductor is suitably controlled to remain at the center of this superconducting transition region, any incident thermal radiation will momentarily raise the temperature, and as a consequence the resistance, which can be measured as an indicator of the amount of incident radiation. Measurement may be affected by passing an AC current through the superconductor and detecting AC voltage changes across the superconductor with a suitable low noise amplifier. This type of device is known in the prior art as a superconducting transition edge bolometer.

Several design problems must be solved with a transition edge bolometer. The superconducting portion that serves as the radiation detector should respond quickly to incident radiation with a suitable temperature rise. This implies a low heat capacity which may be accomplished by keeping the detector quite small. Once the temperature is perturbed, it is desirable that the detector rapidly return to the midpoint temperature of the transition region. This may be accomplished by operating the detector close to a large heat sink or bath and establishing a thermal connection thereto that is of a controllable and predictable thermal conductivity. The size of the thermal connection will, of course, depend on the size and heat capacity of the detector, the desired response rate, and other factors including construction details and electronic considerations.

Superconducting bolometers are known to the prior art in the low critical temperature ($T_c$) domain using, for example, aluminum as the superconducting material evaporated onto a sapphire substrate and operated in a liquid helium bath. Reference should be had to the Journal of Applied Physics, 48(12), December 1977 article titled "Superconductive Bolometers for Submillimeter Wavelengths", Clarke et al., page 4865. The difficulties and expense of operating at the low temperatures needed for low $T_c$ superconductors leads to a desire to be able to employ the recent discoveries of higher $T_c$ materials.

A new family of copper oxide compounds has been developed that offer superconducting transition temperatures much higher and easier to maintain. Examples of these high $T_c$ compounds include various stoichiometric combinations of YBaCuO, LaSrCuO, BiSrCaCuO, and TlBaCaCuO. The particular material $YBa_2Cu_3O_{7-x}$, where x is a number in the range 0.1 to 1, is very popular, showing good electrical and physical properties in a variety of applications. The above compounds, and other similarly behaving superconductors, comprise the high $T_c$ materials to which the present invention is directed. However, the design solutions of the prior art are not appropriate to the new challenges of high $T_c$ superconductors.

The high $T_c$ superconductors are of a class of crystalline structures called perovskites that have poor thermal conductivity. As a result, if used as a bolometer detector, they may experience temperature variations from one point to another resulting in erratic variations in measured resistance at the transition edge. In addition, these materials often contain a variety of different crystal structures or phases with consequent variations in superconductive behavior. New and novel techniques are contemplated by the instant invention to make possible the use of high $T_c$ superconductors in a bolometer device.

SUMMARY OF THE INVENTION

In brief, a high $T_c$ superconductor is bonded to a silicon base structure using either brazing, organic bonding, or metallic bonding methods. The silicon base provides a stable support for the bolometer device so as to facilitate easier patterning and thinning of the superconductor to achieve the desired thermal heat capacity characteristics. Several synergistic additional benefits flow from the silicon as well. The silicon may be etched from the side opposite the bolometer so as to isolate the bolometer detector in space thus defining its total heat capacity. A plurality of small silicon bridges are allowed to remain so as to connect the silicon base to the bolometer. These bridges can be controlled in size by the etch process, or by additional ion doping, to have precise thermal conductance. Hence, the detector will have a precisely defined thermal connection to the silicon base allowing the selection of a desired thermal time constant for the detector. Since silicon is a good thermal conductor itself, the silicon base can be used as the heat sink or cooling bath against which the temperature variations of the detector can be referenced. Still further advantages of the silicon include the ability to form large arrays of bolometers in one cycle of steps using methods well developed in the production of semiconductor devices.

The bonding step enhances the normally poor thermal conductivity of the high $T_c$ materials either through thermal conduction through the bond material itself or if need be, by leaving some silicon base material attached to the detector. Thus, the temperature uniformity of the detector is improved. The following more detailed description and drawings will make more apparent additional benefits and advantages.

DETAILED DESCRIPTION OF THE INVENTION

Figure 1:
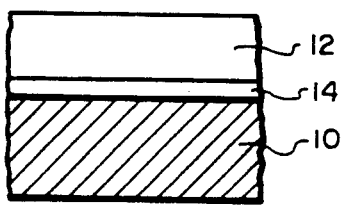
FIG. 1 is a fragmentary, elevational, cross section showing the bolometer structure after the first step in manufacture.
Figure 1A:
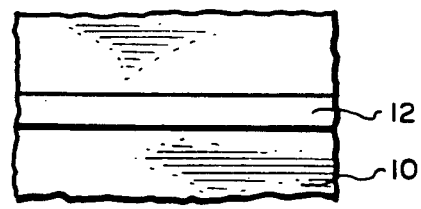
FIG. 1A is a fragmentary plan view of the structure of FIG. 1.

In FIG. 1, a fragmentary portion of a silicon wafer 10 is shown in elevational cross section. A layer of magnesium oxide 12 is bonded to silicon 10 with a suitable bonding layer 14. FIG. 1A shows that layer 12 is deposited as a strip in this explanatory diagram. Actual bolometer designs would no doubt be more complicated in shape, as hereinafter described, but for initial clarity, a simple strip is shown in FIGS. 1A and 3A.

Magnesium oxide is chosen as one possible intermediate layer 12 between the silicon and superconductor for a variety of reasons. Firstly, it has a crystalline structure and lattice spacing similar to the high $T_c$ superconductors. Hence, superconducting films may be epitaxially grown on layer 12 which films have the high quality and uniform crystal structure needed to support good superconductive currents therethrough. MgO also has good thermal conductivity. The composite structure of high $T_c$ material and MgO therefore reaches thermal equilibrium quickly and localized hot spots in the detector are avoided.

An alternative to the use of MgO is sapphire or aluminum oxide, $Al_2O_3$, which could also be used to form layer 12 with similar benefits. For the purposes of this specification, any material which may be bonded to silicon and which provides a good substrate for the epitaxial growth thereon of high $T_c$ superconducting films would be an acceptable alternative.

Bonding layer 14 may be achieved in several ways. The MgO can be directly bonded or brazed to the silicon at high temperatures. Improved adhesion is made possible by first forming a silicon oxide surface coating on the silicon base or with the use of a thin Magnesium or Aluminum layer on the silicon prior to the brazing. An organic glue or bonding substance may also be used as a bonding layer 14. Still another possibility is to deposit a layer of chrome followed by a layer of gold on the surface of the silicon and also on the mating surface of the magnesium oxide. Indium is then deposited on the gold and the two surfaces are joined together and heated. The indium and gold alloy form an alloy which provides a high quality bond with especially good thermal conductivity.

Figure 2:
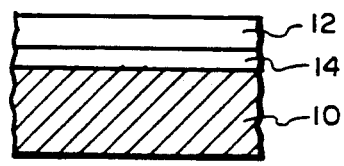
FIGS. 2 and 3 are also elevational cross sections showing subsequent steps in the making of the bolometer.

Once the bonding is completed, the MgO layer 12 may be polished in order to thin it down to a thickness having the correct thermal characteristics for the intended bolometer design, as depicted in FIG. 2. This is easily accomplished with the MgO firmly bonded to silicon base 10. Without the base support 10, the layer of magnesium oxide would be very difficult to work.

Figure 3:
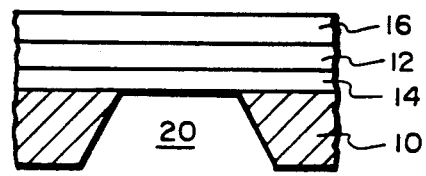
Figure 3A:
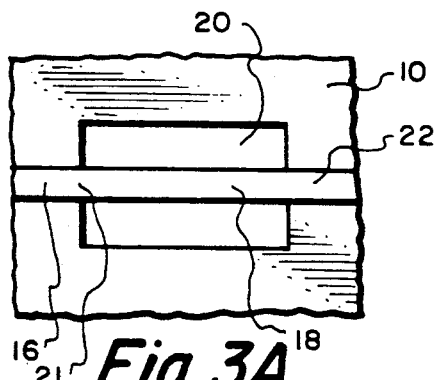
FIG. 3A is an explanatory plan view of the structure of FIG. 3 designed to show, in a simplified way, the principles of the present invention.

A selected high $T_c$ superconductor is then epitaxially grown on layer 12 as shown by high $T_c$ layer 16 in FIG. 3. Layer 16 could be, for example, YBaCuO superconductor, grown in vacuum from one or more sources, evaporated or by sputtering guns or other similar techniques known to those skilled in the art. Good quality high $T_c$ films can be made this way as a consequence of the stability given the growth substrate 12 by the silicon base 10. MgO, by itself, is very thermally unstable in layers thin enough to produce good bolometers.

When epitaxial films are grown on the MgO, or its equivalent, it is necessary to operate at high temperatures which causes distortions in the growth substrate resulting in defects in the superconducting films. The silicon base, bonded to the MgO, alleviates this difficulty.

Finally, a detector portion 18 is thermally isolated by etching away some of the base silicon from the reverse side as shown at 20 in FIG. 3.

Figure 4:
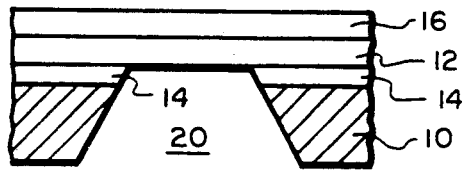
FIG. 4 is a fragmentary elevational cross section showing an optional step in the fabrication process.

Referring to FIG. 3A, if radiation is allowed to impinge on the isolated center part of strip 16, which now comprises a detector portion 18, the temperature rises temporarily with a large increase in resistance. The temperature rise is conducted away to base 10 at a rate dependent on the selected size and composition of the attachment portions 21 and 22, the attachment portions constituting the only thermally conductive path between the base 10 and the detector portion 18. The conduction of heat may also be adjusted, as shown in FIG. 4, by etching away the bonding layer 14 in opening 20. It may be desired, however, to skip this step and leave the bonding layer behind, if the bonding layer 14 comprises a thermally conductive metal such as aluminum or gold or alloys thereof and it is desired to utilize the thermal conductivity of the metal. Also, some thermally conductive silicon could be left on the underside of the bonding layer. The bonding layer may also comprise a brazed junction between the substrate and the base comprising a melted layer of metal selected from the group consisting of aluminum and magnesium.

An alternative sequence to the steps described with respect to FIGS. 1, 2, and 3 is to first remove the silicon to form opening 20 and then deposit the high $T_c$ film on layer 12. This approach would not provide as much intermediate stability to the layer 12, however.

Figure 5:
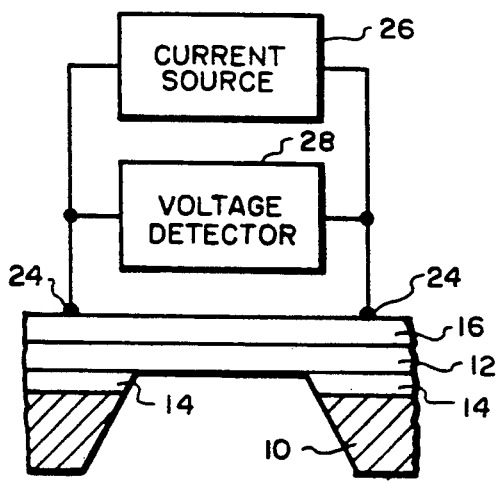
FIG. 5 shows schematically the electrical connections that make a complete bolometer.

A bolometer is achieved, as shown in FIG. 5, by adding electrical contacts 24 to the terminal portions of the superconductor, supplying a current from a source 26 and monitoring the resistance with a detector 28 in a conventional fashion.

Figure 6:
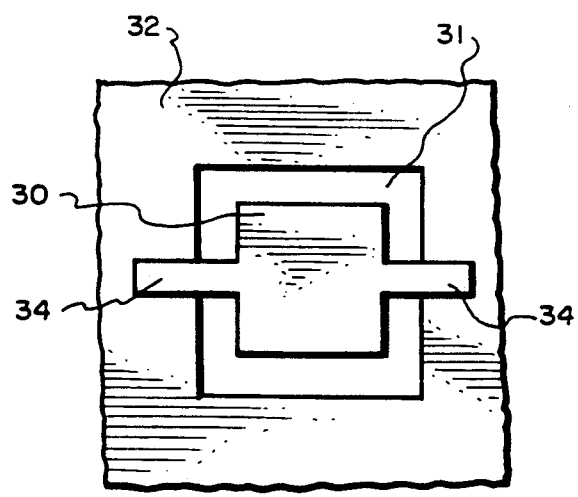
FIG. 6 shows, in plan view, an alternate embodiment to FIG. 3A.
Figure 7:
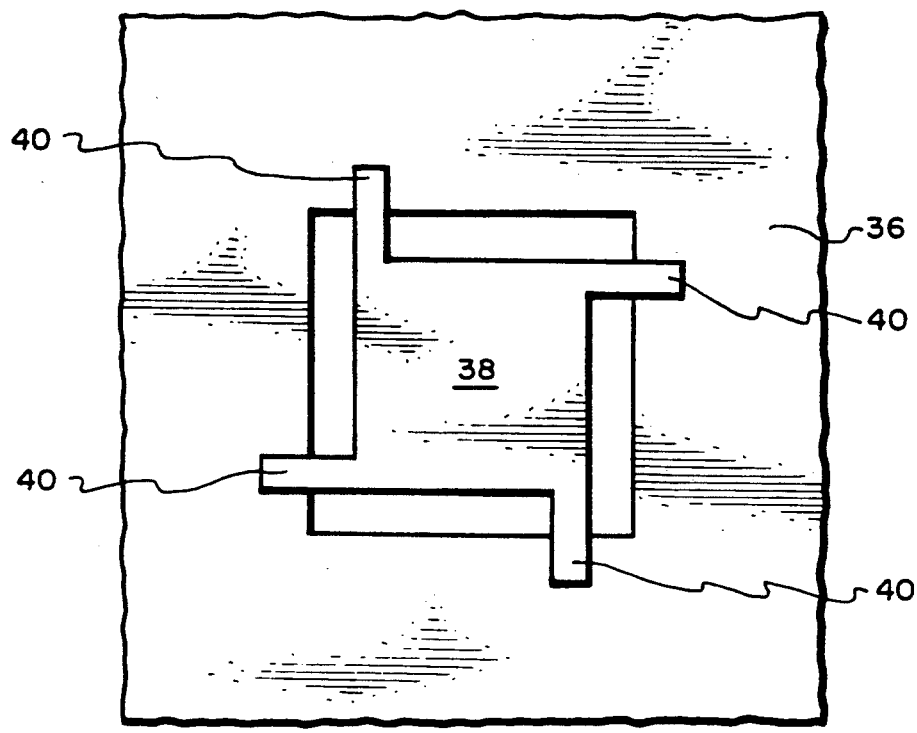
FIG. 7 shows another alternate embodiment of the invention.

The present invention can provide a wide spectrum of practical bolometer configurations. FIG. 6, for example, shows a relatively larger area detector 30 suspended over a hole 31 in a silicon base 32. The radiation receiving area of detector 30 is large in comparison to the thermal conduction paths 34 that connect it to base 32. FIG. 7 shows another variation in which a base 36 supports a detector 38 by means of four combination supports and thermal links 40. Additional supports such as in FIG. 7 could be used to make additional electrical connections to detector 38. This is useful if it is desired to add a resistance heater on detector 38 to assist in maintaining the detector at the middle of the superconducting transition temperature.

Figure 8:
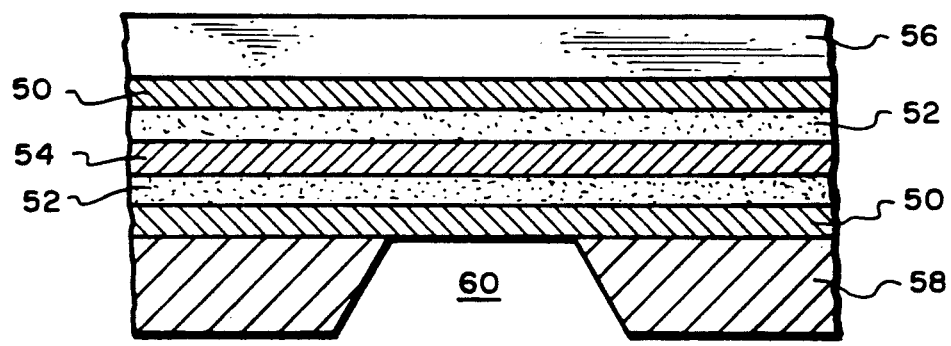
FIG. 8 shows an alternate process for producing the superconducting bolometer of the present invention.

FIG. 8 shows another embodiment of the invention in which a flake of BiSrCaCuO (BSCCO) high $T_c$ superconductor 56 is substituted for the thin film high $T_c$ described earlier. The BSCCO flake is bonded to a silicon base 58 with layers of chrome 50, gold 52, and indium 54 as described with respect to the thin film embodiment. The BSCCO material has the mechanical property that it can be easily flaked, a layer at a time, and thus thinned down to the desired dimensions for an effective bolometer. Afterwards, the silicon is again etched from the opposite side to form suitable openings 60.

Whatever superconducting material is employed, and whatever detector shapes are chosen, they can all be simultaneously constructed on one silicon base so as to create large arrays of bolometers useful in receiving thermal images over an extended plane. The silicon base could provide the necessary electronic circuitry on its surface using standard semiconductor fabrication techniques. By varying the etching rates, and the etch resist patterns, arrays of bolometers may be produced in which selected bolometers have different response characteristics, different sensitivities, and different shapes.

Other variations will occur to those skilled in the art that do not depart from the spirit and scope of the invention. Thus, we intend to be bound only in accordance with the following claims.

I claim:

1. A superconducting transition edge bolometer adapted to change electrical resistance in the region corresponding to the onset of superconductivity in response to incident radiation comprising:
    a high Tc superconducting circuit element means comprising a thermally conductive substrate of material with a crystalline structure and lattice spacing substantially the same as that of copper oxide high Tc superconductors so as to support the epitaxial growth of said copper oxide superconductors thereon, and further comprising a layer of copper oxide superconductor epitaxially formed on said thermally conductive substrate, said circuit element means shaped so as to have a central detection portion and at least two thermally conductive attachment portions connected to said detection portion;
    a silicon base forming a reference cooling bath means;
    a thermally conductive bonding layer between said base and said attachment portions;
    an opening in said base positioned to thermally isolate said detection portion from said base and form a thermally conductive path only through said attachment portions to said base; and
    means to monitor the resistance of said circuit element means as an indicator of the incidence of radiation on said detection portion.

2. The bolometer of claim 1 in which said substrate comprises magnesium oxide.

3. The bolometer of claim 1 in which said substrate comprises aluminum oxide.

4. The bolometer of claim 1 in which said bonding layer comprises a metal.

5. The bolometer of claim 1 in which said bonding layer comprises an organic glue.

6. The bolometer of claim 1 in which the bonding layer comprises a brazed junction between said substrate and said silicon base.

7. The bolometer of claim 1 in which the bonding layer comprises layers of chrome, gold, and indium on the silicon base fused and alloyed to layers of chrome, gold, and indium on said substrate.

8. The bolometer of claim 7 in which said substrate is magnesium oxide.

9. The bolometer of claim 7 in which said substrate is aluminum oxide.

10. The bolometer of claim 1 in which said bonding layer extends beyond said attachment portions and across said detection portion so as to provide an additional thermal conduction path from the detection portion to the silicon base.

11. The bolometer of claim 10 in which said bonding layer comprises a metal alloy layer.

12. The bolometer of claim 11 in which said substrate is magnesium oxide.

13. The bolometer of claim 11 in which said substrate is aluminum oxide.

14. The bolometer of claim 10 in which the bonding layer comprises a brazed junction between said substrate and said silicon base.

15. The bolometer of claim 14 in which the bonding layer is a melted layer of metal selected from the group consisting of aluminum and magnesium.

16. The bolometer of claim 10 in which the bonding layer comprises layers of chrome, gold, and indium on the silicon base fused and alloyed to layers of chrome, gold, and indium on said substrate.

17. The bolometer of claim 10 in which said substrate is magnesium oxide.

18. The bolometer of claim 10 in which said substrate is aluminum oxide.

* * * * *